United States Patent [19]

Hammick

[11] Patent Number: 5,764,572
[45] Date of Patent: Jun. 9, 1998

[54] INTEGRATED CIRCUIT MEMORY DEVICE

[75] Inventor: Michael Charles Hammick, Almondsbury, United Kingdom

[73] Assignee: SGS-Thomson Microelectronics Limited, Almondsbury, United Kingdom

[21] Appl. No.: 868,478

[22] Filed: Jun. 3, 1997

Related U.S. Application Data

[63] Continuation of Ser. No. 559,305, Nov. 15, 1995.

[30] Foreign Application Priority Data

Nov. 15, 1994 [GB] United Kingdom ............ 9423036

[51] Int. Cl.$^6$ .................................................. G11C 13/00
[52] U.S. Cl. ............................... 365/189.01; 365/185.33; 365/218; 365/233
[58] Field of Search ........................... 365/189.01, 205, 365/189.05, 189.07, 190, 233, 218, 185.33

[56] References Cited

U.S. PATENT DOCUMENTS

| | | | |
|---|---|---|---|
| 4,777,625 | 10/1988 | Sakui et al. | 365/189.05 |
| 4,980,863 | 12/1990 | Ogihara | 365/205 |
| 5,088,065 | 2/1992 | Hanamura et al. | 365/208 |
| 5,311,469 | 5/1994 | Hoshi et al. | 365/189.5 |

FOREIGN PATENT DOCUMENTS

| | | | |
|---|---|---|---|
| A-0 329 910 | 8/1989 | European Pat. Off. | G11C 7/06 |
| 61-184794 | 8/1986 | Japan | G11C 17/00 |
| 1-277396 | 11/1989 | Japan | G11C 17/00 |
| 02078099 A | 3/1990 | Japan | G11C 16/06 |
| 2-66798 | 3/1990 | Japan | G11C 16/06 |
| 2-78099 | 3/1990 | Japan | G11C 16/06 |
| 04119597 A | 4/1992 | Japan | G11C 17/18 |
| 4-119597 | 4/1992 | Japan | G11C 17/18 |
| 6-282993 | 10/1994 | Japan | G11C 16/06 |

OTHER PUBLICATIONS

Japanese Office Action, Appln. No. 296526/1995, mailed Mar. 25, 1997, with English translation.
English translation of portion of JP 6-282993, Oct. 7, 1994.
English translation of portion of JP 4-119597, Apr. 21, 1992.
JP 02078099 A (English language abstract of JP 2-78099).
JP 04119597 A (English language abstract of JP 4-119597).
Standard Search Report issued by the European Patent Office on Feb. 1, 1995.
1990 IEEE International Solid State Circuits Conference; Digest of Technical Papers, Feb. 14, 1990 San Francisco, pp. 58-50; Atsumi, et al., "Non-Volatile and Fast Static Memories".

*Primary Examiner*—Terrell W. Fears
*Attorney, Agent, or Firm*—Wolf, Greenfield & Sacks, P.C.

[57] ABSTRACT

An improved sensing device for an integrated circuit memory device is provided. In particular, the memories can be those in which memory cells are formed by insulated gate transistors, such as EPROMs and flash EPROMs. Conventionally, such memories use static sence amplifiers. The present invention provides a dynamic sence amplifier suitable for use in these memories.

18 Claims, 8 Drawing Sheets

FIG. 3

| | Selected Cell | | | Unselected Cell Same Row | | | Unselected Cell Same Column | | |
|---|---|---|---|---|---|---|---|---|---|
| | Drain Voltage | Gate Voltage | Source Voltage | Drain Voltage | Gate Voltage | Source Voltage | Drain Voltage | Gate Voltage | Source Voltage |
| PROGRAM | ~5V | $V_{PP}$ | $V_{GND}$ | $V_{GND}$ | $V_{PP}$ | $V_{GND}$ | ~5V | $V_{GND}$ | $V_{GND}$ |
| ERASE* | FLOATING | $V_{GND}$ | $V_{PP}$ | FLOATING | $V_{GND}$ | $V_{PP}$ | FLOATING | $V_{GND}$ | $V_{PP}$ |
| READ | BIASED TO ~1V | ~5V | $V_{GND}$ | $V_{GND}$ | ~5V | $V_{GND}$ | BIASED TO ~1V | $V_{GND}$ | $V_{GND}$ |

\* ALL CELLS SELECTED IN ERASE

INTEGRATED CIRCUIT MEMORY DEVICE

This application is a continuation of application Ser. No. 08/559,305, filed Nov. 15, 1995.

FIELD OF THE INVENTION

This invention relates to an integrated circuit memory device, and in particular to improved sensing circuits in an integrated circuit memory device.

BACKGROUND TO THE INVENTION

The invention is particularly but not exclusively concerned with a memory device in which memory cells are formed by insulated gate transistors. These memories include EPROMs and FLASH EPROMs referred to herein as flash memories.

In known flash memories, the sense amplifiers are implemented as static sense amplifiers. A static sense amplifier continuously senses the signal differential between its inputs. In the case of a single transistor memory cell the inputs can be connected to the bit line of an accessed memory cell and a reference signal. This contrasts with a memory cell having an access transistor and a storage element such as is found in an SRAM with the storage element comprising a latch, where the inputs to the sense amplifier are the selected bit line and its complement. The signal differential may be a current or a voltage differential. This signal differential is usually very small, and the sense amplifier must have a high gain and therefore requires more than one amplification stage. Each amplification stage requires accurate biasing in order to maintain the sensing stages in the regions of high gain in the presence of process skews. This requirement for accurate biasing necessitates the provision of accurate reference voltages for each amplification stage which is difficult to achieve, particularly for memory devices which are compatible with different power supply voltages. For example, a typical memory chip can operate with a power supply voltage of 3.3 V±0.3 V or with a power supply voltage of 5 V±10%.

The actual power supply voltage therefore has extremes of 3.0 V and 5.5 V. In addition, the requirement for several amplification stages results in the sense amplifier circuitry occupying a large amount of chip area, and also having a high power requirement.

Conversely dynamic sense amplifiers consume much less chip area and require less power. In a dynamic sense amplifier, once a small differential has developed on the inputs to the sense amplifier the sense amplifier is responsive to a clocked signal to allow a regenerative feedback action to develop a full CMOS signal on the output of the sense amplifier. Such a sense amplifier does not require accurate biasing and is therefore ideal for applications in which the supply voltage may vary over a wide range. Dynamic RAM (DRAM) cells comprise a storage element, consisting of a capacitor, and an access transistor. The regenerative feedback action of a dynamic sense amplifier RAM can be used to restore the level of the storage element in the cell, which is degraded during the read process, by writing the signal back onto the bit lines. However, in a flash memory cell the bit lines need to be maintained at a fairly low voltage (at less than 1 V) in order to reduce stress, which would cause the stored data in the cells to be affected over a long period.

It is therefore an object of the present invention to provide a dynamic sense amplifier suitable for use in a memory having single transistor cells.

SUMMARY OF THE INVENTION

According to the present invention there is provided an integrated circuit memory device comprising:

an array of memory cells arranged in rows and columns, with cells in a row being connected to a common word line and cells in a column being connected to a common bit line, each memory cell storing a data bit;

sense circuitry for reading a data bit stored in a selected one of said memory cells;

switch circuitry for connecting the bit line associated with the selected memory cell to said sense circuitry;

wherein said sense circuitry comprises:

a dynamic sense amplifier having first and second input terminals for connection respectively to the selected bit line and a reference signal and first and second output terminals, said dynamic sense amplifier also including latch circuitry for driving said first and second output terminals to opposite logic states in dependence on the state of the differential between a signal on said selected bit line and said reference signal, one of said logic states being determined by a supply voltage for the dynamic sense amplifier;

clamping circuitry connected to said first and second output terminals to hold them at a common precharged signal level and responsive to a release signal to release said first and second output terminals;

biasing circuitry for biasing the selected bit line to a predetermined voltage level;

isolation circuitry connected between said dynamic sense amplifier and said selected bitline and reference signal and operable during a first stage of a read cycle to adopt a first state to connect said selected bitline and reference signal to said dynamic sense amplifier and responsive to an isolate signal to adopt a second state in a second stage of the read cycle wherein said selected bitline and reference signal are isolated from said dynamic sense amplifier, said biasing circuitry being connected to said supply voltage via restore circuitry when the isolation circuit is in the second state.

For a better understanding of the present invention and to show how the same may be carried into effect, reference will now be made by way of example to FIGS. 1 to 8 of the accompanying drawings.

BRIEF DESCRIPTION OF THE DRAWINGS

FIG. 3 illustrates in tabular form the signals applied to various cells within the flash memory array during operation;

DESCRIPTION OF THE PREFERRED EMBODIMENT

Figure 1:
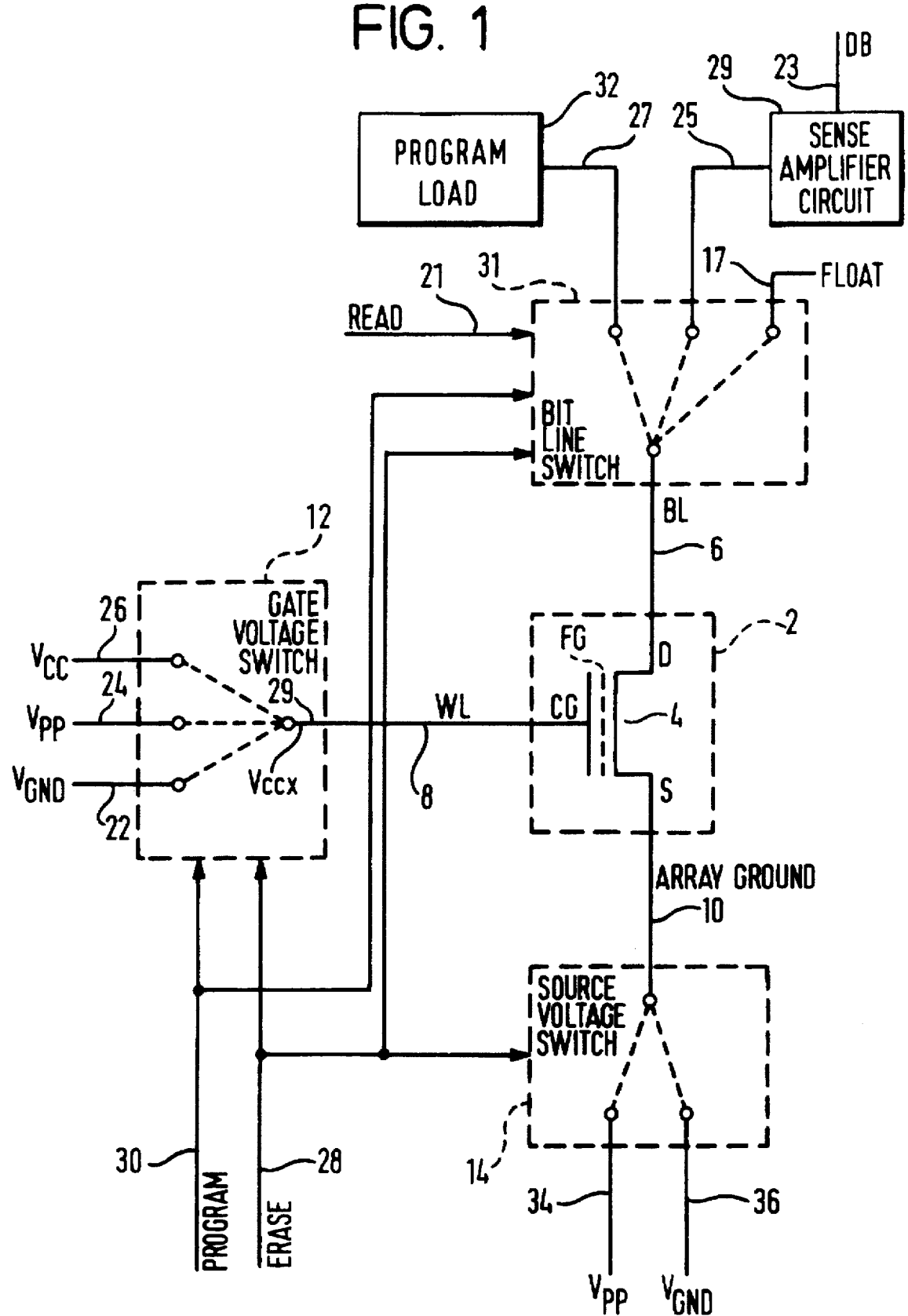
FIG. 1 is an illustrative example of a basic flash memory cell showing the different signal levels which can be applied to the cell.

FIG. 1 illustrates a flash memory cell 2 comprising a single floating gate transistor 4 having a control gate CG, a floating gate FG, a source S, and a drain D. The source S of the floating gate transistor 4 is connected to an ARRAY GROUND signal on line 10. Through a source voltage switch circuit 14 this line 10 can be at a ground voltage VGND or a high voltage Vpp. Voltage Vpp represents a programming potential (typically 12 V) and voltage VGND represents device ground. Vpp is normally connected to array ground, either directly or via a resistor (not shown). The source voltage switch 14 is connected to the voltage Vpp via line 34 and the voltage VGND via line 36. The control gate CG of the floating gate transistor 4 is connected to the output signal Vccx of a gate voltage switch 12 by a word line (WL) 8. The gate voltage switch 12 is further connected to voltages Vcc, Vpp and VGND on lines 26, 24 and 22 respectively. Vcc is at 5 V for a 5 V part or 3 V for a 3 V part. These switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch is further connected to the output of a program load 32 on write line 27, the input of a sense amplifier circuit 29 on read line 25, and a floating connection FLOAT on line 17. It will be appreciated that in an array a plurality b of selected bit lines may simultaneously be connected to the sense amplifier circuit 29 during a read operation so that line 25 will be normally implemented as b lines. Similarly, during a program operation a plurality b of selected bitlines may simultaneously be connected to the program load 32, so that line 27 will also normally be implemented as b lines. In the described embodiment b=8. The switch 31 receives a control signal READ on line 21, in addition to the control signals PROGRAM and ERASE on lines 30 and 28 respectively.

The flash memory has three primary modes of operation: program, erase and read. Each of these modes will be described hereinafter with reference to FIG. 1. It will be understood by a person skilled in the art that several other modes of operation, such as program verify for example, also exist. However, the present description is by way of background illustration only and therefore only these three modes will be described. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e. contains either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The bit line switch 31 is set such that the bit line on line 6 is connected to the program load 32 by line 27. The program load 32 is such that a voltage of between 4 and 8 V is on the drain D of the transistor 4 via the bit line 6. As a result of these signals applied to the transistor 4 the floating gate FG becomes negatively charged. The negative charge increases the threshold voltage of the floating gate transistor making it less conductive. The amount of negative charge accumulated at the floating gate depends on several factors, including the duration for which the control signal PROGRAM is set, the voltages applied to the gate and drain terminals, and the thickness of the oxide separating the floating gate from the channel of the transistor. Furthermore, as the cell is programmed the accumulation of negative charge on the floating gate causes the electric field across the field oxide to reduce such that a point is reached where no more negative charge is attracted to the floating gate such that the threshold voltage of the floating gate transistor saturates to a limit. In this way, a "0" is written into the cell. Normally, several program pulses may be needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The bit line switch 31 is set such that the bit line 6 is connected to the floating connection FLOAT on line 17 so that it floats. As the floating gate transistor is fabricated such that the source region in the substrate underlies the floating gate, any negative charge on the floating gate will be reduced. The amount of negative charge removed from the floating gate FG depends on the various factors as discussed hereinabove with reference to a program operation. The reduction of negative charge reduces the threshold voltage of the floating gate transistor making it more conductive. In this way the state of the cell is restored to "1". Normally, several erase pulses may be required, each erase pulse being followed by a verify cycle.

During a read mode, neither the control signal ERASE on line 28 nor the control signal PROGRAM on line 30 are set, but the READ signal on line 21 is set. The Vcc signal on line 26 is connected by the source voltage switch 12 to the control gate of the transistor 4 via the line Vccx and the word line 8. If the device is a 3 V part, the supply voltage vcc is disconnected from the signal Vccx, and hence the wordline WL 8, is boosted above Vcc by means not shown. The voltage VGND on line 36 is connected to the source of the transistor 4 via the ARRAY GROUND signal line 10. The bit line 6 is biased to approximately 1 volt during a read operation by means (discussed later) within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell. The current passed (or not) by the cell is compared with a reference current to detect the status of the cell, as described in more detail in the following description.

The operation of a flash cell in a memory array will now be described with reference to FIG. 2. Signal lines or circuitry common to FIG. 1 can be identified in FIG. 2 by use of the same reference numerals. Voltage supplies have not been illustrated in FIG. 2 for reasons of clarity, but it will be understood with reference to FIG. 1 which voltages are required in various parts of the circuit.

Figure 2:
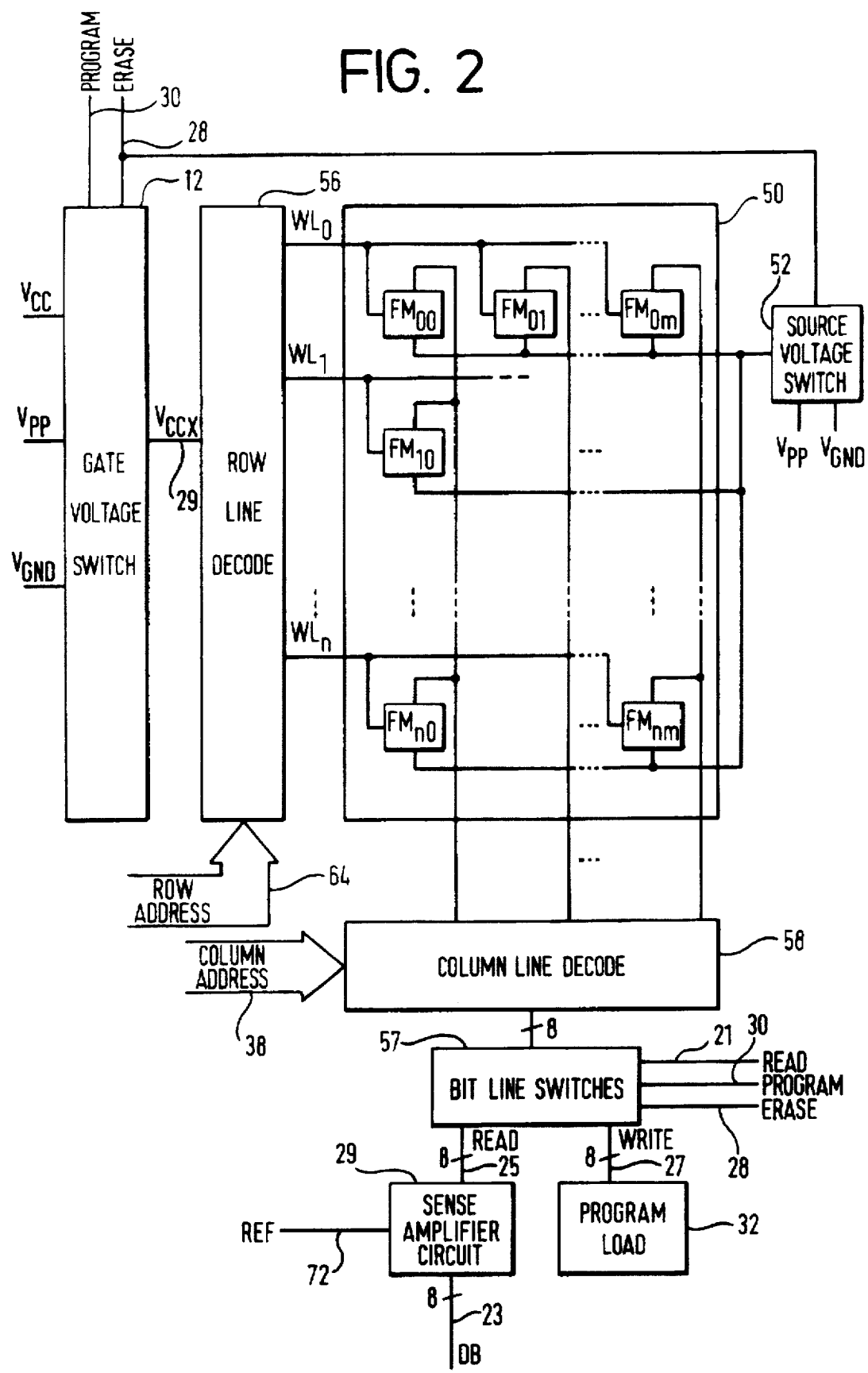
FIG. 2 is an illustrative block diagram of the overall structure of a flash memory array.

FIG. 2 illustrates a flash memory array 50 comprising a plurality of flash memory cells FMoo . . . FMnm, arranged in rows and columns, each of which can be the same as the cell 2 shown in FIG. 1. The gates of the transistors in each memory cell in a row are commonly connected to a respective word line WLo . . . WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 29 to be switched to the addressed wordline through the row decode circuit 56.

The drains of each transistor in a column are commonly connected by bit lines BLo ... BLm to a column line decode circuit 58. The column line decode circuit selects a plurality b (in this example, b=8) of the bit lines BLo to BLm to be connected to a plurality b of bit line switches 31 shown in FIG. 2 as a block of bit line switches 57. Therefore eight of the m bitlines BLo ... BLm are selected by the column address 38 to be connected to the eight bit line switch circuits. The outputs of the bit line switches 57 on line 25 is a read output and is connected to the sense amplifier circuit 29. The sense amplifier circuit 29 contains a plurality of sense amplifiers (eight in the described embodiment to allow eight bits to be read in a common cycle), and hence the output on line 25 is actually a plurality of bits wide (eight in the described example). The bit line switches receive a write input on line 27 from the program load 32. During a program operation eight of the bit lines BLo to BLm are selectively connected to the program load 32. The program load 32 similarly comprises a plurality (in this example eight) of program loads, and hence the input on line 27 is actually also eight bits wide. During a read operation the selected bit line (or bit lines) are connected to the sense amplifier circuit 29. The sense amplifier circuit 29 also receives a reference signal REF on line 72 and generates output signals on the data bus (DB) 23, which is an eight bit bus in the described embodiment. The respective output signals are generated by comparing the signals on the respective bitlines with the reference signal REF.

It will be appreciated that when a particular cell is chosen to be programmed, the program load will only be applied to a selected column so that other cells in the same row as the selected cell are not inadvertently programmed. Unselected columns are clamped to ground to avoid coupling from neighbouring selected bit lines. The signals existing on the various nodes of cells in an array for various operations are summarised in FIG. 3. During an erase operation every cell in the memory array is erased, although it will be appreciated by a person skilled in the art that an array could be split into sectors for erasing so that only part of the array is erased at any one time. During an erase operation the bitlines are allowed to float to reduce stress across the source/drain terminals since the sources are taken to a very high voltage.

When the sense amplifier circuit 29 is a current sensing sense amplifier, the reference signal REF on line 72 will be a current reference signal. However, there is a problem if the capacitance associated with the source for the current reference signal REF differs significantly from the capacitance of the bit line to which the selected cell is connected, since capacitive balancing is needed for good sensing. However, this is not simple to achieve in a single transistor flash EPROM. As each cell contains only one transistor, it is not possible to use a folded bit line scheme as is implemented commonly on dynamic random access memories (DRAMs). Furthermore, although in principle a dummy bit line could be used in association with each active bit line, this would increase the required space in the layout and make the chip much larger. The advantages of dynamic sense amplifiers, as stated hereinbefore, have not been realised up until now due to many design criteria which need to be addressed, e.g. capacitive input balancing, device matching, sensing integrity, the need to reduce noise on the inputs to a minimum etc., which are addressed herein.

Figure 4:
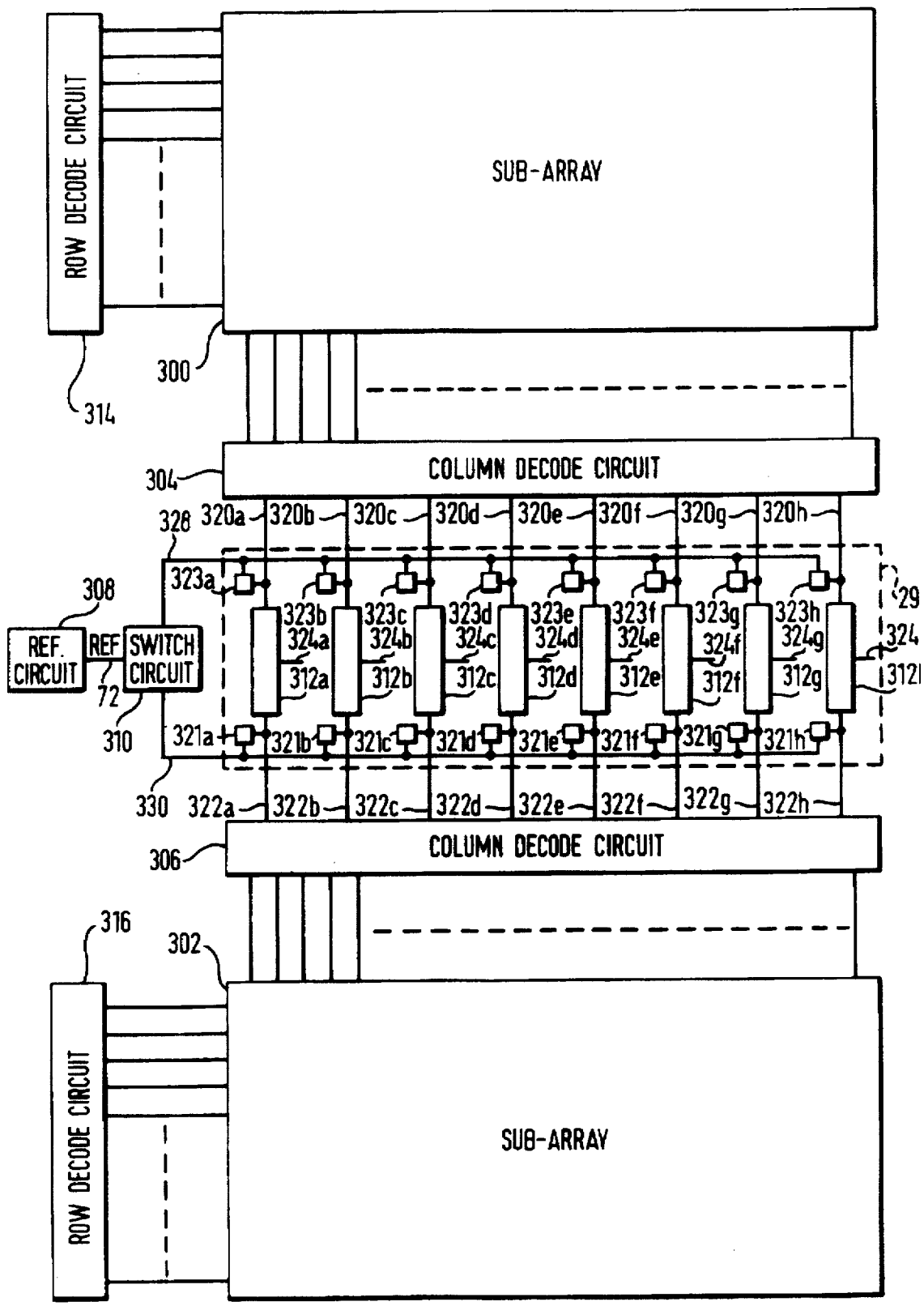
FIG. 4 is a schematic diagram of the overall structure of a flash memory array in which the present invention may be implemented.

FIG. 4 illustrates diagrammatically part of a memory structure, shown by way of illustrative example, which allows a dynamic current sense amplifier to be implemented. The memory of FIG. 4 has two sub-arrays, a first sub-array 300 and a second sub-array 302. Each of the sub-arrays may be similar to the array 50 of FIG. 2, having n rows and m columns. The gate voltage switch 12, source voltage switch 52 and program load 32 of FIG. 2 have been omitted from FIG. 4 for reasons of clarity, but it should be noted that the distribution of such circuitry will be dependent upon the particular implementation. It may be possible for the present invention to be implemented in memories having different architectures.

The first sub-array 300 has an associated first row decode circuit 314 and an associated first column decode circuit 304. The second sub-array 302 has an associated second row decode circuit 316 and an associated second column decode circuit 306. The respective row decode circuits drive the n wordlines of the respective arrays. The addressing and control circuitry for the row decode circuits is not shown for reasons of clarity. The respective column decode circuits address the bidirectional m column lines of the respective arrays. Similarly, the addressing and control circuitry for the column decode circuits is not shown for reasons of clarity. The memory structure also comprises a sense amplifier circuit 29 containing eight sense amplifiers 312a to 312h, a switch circuit 310, and a reference circuit 308. Each sense amplifier 312a to 312h receives an input from a respective one of a first set of read lines 320a to 320h from the first column decode circuit 304, and an input from a respective one of a second set of read lines 322a to 322h from the second column decode circuit 306. Each sense amplifier 312a to 312h generates an output on a respective data line 324a to 324h. The switch circuit 310 receives as an input the reference signal REF on line 72 from the reference circuit 308.

The switch circuit 310 selectively connects the reference signal REF to a first output line 328 which is commonly connected to one terminal of a set of switches 323a to 323h. Each of the switches has a respective second terminal connected to a respective one of the read lines 320a to 320h. The switch circuit 310 also selectively connects the reference signal REF to a second output line 330 which is connected to one terminal of a set of switches 321a to 321h. Each of the switches has a respective other terminal connected to a respective one of the read lines 322a to 322h. The switch circuit 310 and the switches 321a to 321h and 323a to 323h are selectively controlled such that when the signal REF is applied to the line 328 all the switches 321a to 321h are open and all the switches 323a to 323h connect the signal REF on line 328 to the respective read lines 320a to 320h.

Conversely, when the signal REF is applied to the line 330 all the switches 323a to 323h are open and all the switches 321a to 321h connect the signal REF on line 330 to the respective read lines 322a to 322h.

Each array 300 and 302 is an active array, not a "dummy" array, i.e. each array contains addressable memory cells storing data bits. However, the row decode circuits 314 and 316 are independently addressable so that when a wordline in the first array 300 is selected, no wordline in the second array 302 is selected and vice versa.

The column decode circuits 304 and 306 can be commonly addressed so as to connect the sense amplifiers 312a to 312h to the bit lines associated with the addressed memory cells in one of the first and second arrays 300 and 302 and the corresponding bit lines (on which no cells are addressed) in the other of the first and second arrays 300 and 302. The column decode circuit 304 connects eight of the m bit lines of the first array 300 to the read lines 320a to 320h, and the column decode circuit connects the corresponding eight of the m bit lines of the second array 302 to the read lines 322a to 322h. The "corresponding bit line" in this context means the bit line which is vertically below (or above, as the case may be) the bit line connected to the addressed memory cell, i.e. the bit line in the other sub-array having the same column address as the addressed memory cell.

As explained above, each sense amplifier compares the signal on the bit line of the addressed cell with the reference signal REF from the reference circuit 308.

For an addressed memory cell in the first array 300, the cells connected to the corresponding bit line of the second array 302, which are connected through the column decode circuit 306 to the same sense amplifier as is connected to the bit line of the addressed cell, provide a perfect capacitive match for sensing. The reference circuit 308 is connected via the switch 310 to provide the current reference signal REF on line 72 to the corresponding bit line in the second array 302, that is the bit line on which no cells have been addressed.

It should be apparent from the above description that only one of the two arrays has a wordline activated although the column decode circuits 304 and 306 associated with each array are activated. Depending on whether the addressed cell is erased or programmed, it may draw a current from its bit line. If the cell is erased, a current flows, while if it is programmed substantially no current flows. No current flows in the corresponding bit line because no wordline is selected (all are grounded).

The reference circuit 308 is preferably a constant current generator and generates a reference current which, in combination with the switches 323a to 323h or the switches 321a to 321h, is mirrored onto each of either the first or second inputs respectively of each of the sense amplifiers 312a to 312h. Control of the switch 310 is derived from one address bit stored elsewhere in the memory which can be the same bit which selects one of the two arrays 300 or 302. The reference current can be derived from a memory cell specially kept for this purpose, and the current is set to be less than that drawn by an erased cell in the array, but more than that drawn by a programmed cell. In practice, the reference current is set to be a fraction of the sum of the currents of an erased cell and a programmed cell. In the preferred embodiment, this fraction is a half.

As can be seen, in the above arrangement the capacitance associated with the respective two inputs of the sense amplifiers 312a to 312h is balanced, because there are an equal number of memory cells attached to each bit line. Therefore, depending on whether the addressed cell in the addressed array is programmed or erased, the difference in the currents drawn from the two inputs of the sense amplifier will cause a small voltage difference which can be sensed by the sense amplifer. Any on-chip noise (for example due to coupling within the column decode circuitry) will affect both bit lines equally. The sense amplifier relies on differential sensing and this noise will be common mode.

Figure 5:
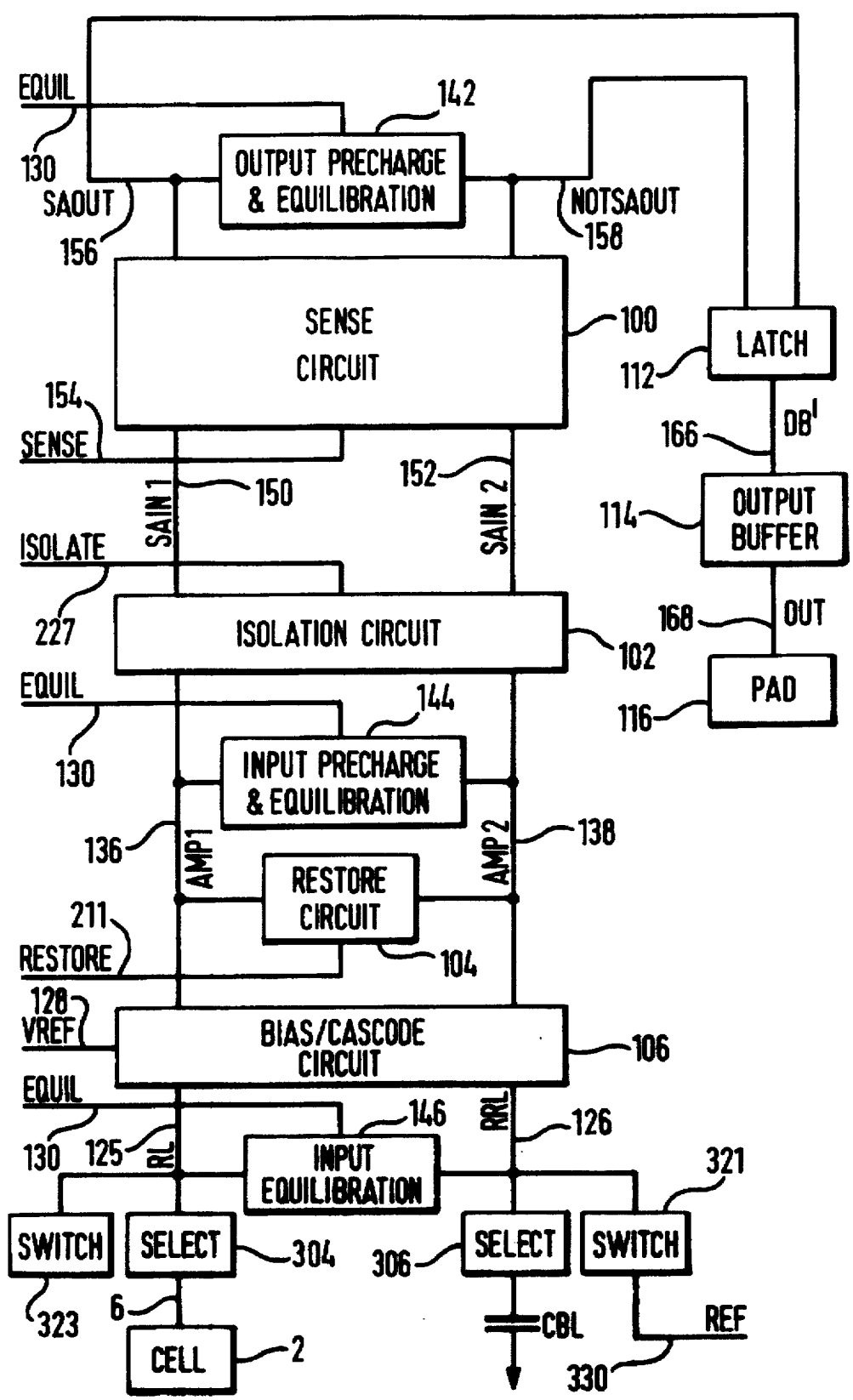
FIG. 5 is an illustrative block diagram of a dynamic sense amplifier according to the present invention.

Reference is now made to FIG. 5, which illustrates a schematic block diagram of a dynamic sense amplifier according to one embodiment of the present invention. Each sense amplifier 312a ... 312h can be such a dynamic sense amplifier circuit. In the example given in FIG. 5 the bit line balancing technique described with reference to FIG. 4 is used by way of example, with a cell to be read being in the sub-array 300, the sub-array 302 being used for capacitive balancing. It will be understood that the signal pair being sensed could be otherwise derived, for example a complementary bit line pair as found in SRAMs.

The sense amplifier comprises a bias/cascode circuit 106 which receives an input on a read line RL 125 of the 8 bit read bus 25 from an accessed cell 2 on a selected bit line 6 of the memory sub-array 300 via a bit line switch and the column decode circuit 304, and an input on a reference read line RRL 126 which is the reference signal REF applied from the reference circuit 308 via one of the switches 321. The read reference line RRL is also connected to the corresponding bit line via the bit line switch and the column decode circuit 306, represented by a capacitance $C_{BL}$ formed by a balanced bit line. The read line is also connected to the switch 323, which will be an open circuit. In the event that a balanced bit line scheme is not being utilised, a dummy bit line and switch would have to be chosen to match as closely as possible the switch of the column decode circuit and the bit line capacitance $C_{BL}$. The bias/cascode circuit 106 also receives a reference voltage VREF on input line 128. An input equilibration circuit 146 has a first terminal connected to the read line RL 125, a second terminal connected to the read reference line RRL 126, and is controlled by an equilibration signal EQUIL on line 130. The bias/cascode circuit generates a first output AMP1 on a first amplified output line 136 and a second output AMP2 on a second amplified output line 138.

The amplified outputs AMP1 and AMP2 on lines 136 and 138 form inputs to an isolation circuit 102. An input precharge and equilibration circuit 144 has a first terminal connected to the first amplified output AMP1 on line 136, a second terminal connected to the second amplified output terminal AMP2 on line 138, and is controlled by the equilibration signal EQUIL on line 130. A restore circuit 104 has a first terminal connected to the first amplified output AMP1 on line 136, a second terminal connected to the second amplified output AMP2 on line 138, and receives a restore control signal RESTORE on line 211. The isolation circuit 102 selectively connects the signal AMP1 to a signal output SAIN1 on a first sense input line 150 and the signal AMP2 to a signal output SAIN2 on a second sense input line 152 under the control of an isolation control signal ISOLATE on line 227. The sense input lines 150 and 152 form first and second inputs to a sense circuit 100, which additionally receives an activation control signal SENSE on line 154. The sense circuit 100 has a first output terminal 156 forming a true output SAOUT, and a second output terminal 158 forming an inverse output NOTSAOUT.

An output precharge and equilibration circuit 142 has a first terminal connected to the true output SAOUT on line 156, a second terminal connected to the inverse output NOTSAOUT on line 158, and is controlled by the equilibration signal EQUIL. A latch 112 receives as inputs the complementary output signals SAOUT and NOTSAOUT on output terminals 156 and 158 and generates an output on line 166 which is one line DB' of the 8 bit databus DB. The signal DB' on line 166 forms an input to an output buffer 114 which in turn generates an output OUT on line 168 which is connected to an output pad 116.

The sense circuit 100 consists of a cross-coupled arrangement of transistors for performing dynamic sensing of a voltage differential on the sense inputs SAIN1 and SAIN2 on lines 150 and 152. Prior to applying a differential signal to the inputs of the sense circuit the cross-coupled arrangement of transistors can be held in a meta-stable state until the input differential signal on sense input lines 150 and 152 is sufficient to force the sense circuit into one of its two stable states, namely logic "0" or logic "1" on one output, with the inverse on the other. The state of the input differential signal on sense inputs SAIN1 and SAIN2 on lines 150 and 152 is used to determine the logic level on the true output SAOUT on terminal 156 when it changes from its meta-stable state into one of its two stable states. The control signal SENSE on line 154 determines when the sense circuit is released from its meta-stable state and allowed to adopt one of its stable states. Such cross-coupled transitor arrangements for dynamic sense amplifiers are well known in the art and their operation should be readily understood by a person skilled in the art. A detailed description of a cross-coupled arrangement which may be used in conjunct ion with a preferred embodiment of the present invention will be given hereinbelow.

The function of each of the blocks shown in FIG. 5 will now become apparent in the following description. The operation of the dynamic sense amplifier illustrated schematically in FIG. 5 will be described for a normal read cycle.

Prior to the start of the read cycle, the sense amplifier is inactive, and the equilibration control signal EQUIL is set such that the input equilibration circuit 146, input precharge and equilibration circuit 144 and output precharge and equilibration circuit 142 are all switched on. When switched on, the output precharge and equilibration circuit 142 precharges the true output SAOUT and inverse output NOT-SAOUT on lines 156 and 158 to a known level, and also camps the two signal lines together. Similarly, the input precharge and equilibration circuit 144 precharges the amplified out puts AMP1 and AMP2 on lines 136 and 138 respectively to a known level, and also clamps the two signal lines together. Furthermore the input equilibration circuit 146 clamps together the signal lines RL and RRL on lines 125 and 126 respectively. The signal level of the signals RL and RRL at this stage is determined by the bias/cascode circuit 106. The isolation control signal ISOLATE on line 227 is set such that the inputs AMP1 and AMP2 on lines 136 and 138 of the isolation circuit 102 are connected directly to the respective outputs SAIN1 and SAIN2 on lines 150 and 152. Therefore the signals SAIN1 and SAIN2 are clamped together and precharged by the input precharge and equilibration circuit 144 in the same manner as the signals AMP1 and AMP2. The restore control signal RESTORE on lines 211 is set at this time such that the restore circuit 104 is disabled.

It will be appreciated that since during the precharge and equilibration phase the signals AMP1 and AMP2 are directly connected to the signals SAIN1 and SAIN2, the input precharge and equilibration circuitry could be alternatively connected with its first and second terminals connected to the signals SAIN1 and SAIN2 on lines 150 and 152. The control signal SENSE on line 154 is set such that the sense circuit 100 is disabled. At this point, with the dynamic sense amplifier in its default state, the control signal EQUIL is set to precharge all the signal lines 156,158,150,152,136,138 to a high level. The reference signal VREF supplied to the bias/cascode circuit 106 on line 128 is set such that the voltage on the lines 125 and 126 are both identical and are equal to the required bias voltage, namely just less than 1 V. The voltages on the amplified outputs AMP1 and AMP2 on lines 136 and 138, which are the supply voltage Vcc at this time, provide the potential source for the biasing operation of the bias/cascode circuit 106, the reference signal VREF effectively being a control signal to determine the level of the bias voltage. This biasing arrangement for the read line RL and the reference read line RRL, and hence the bit lines, is known for flash memories.

In a flash memory device, the selected bit lines are required to be biased to a relatively low voltage, preferably less than 1 V during a read operation. During the lifetime of a flash memory device, the majority of operations will be read operations, and it is therefore necessary to minimise the drain stress of the cells on the bit lines during these read operations. If the bit lines were biased to a relatively high voltage the drain stress of the cells may lead to loss of charge from the floating gates of the cells, and consequently partial erasure of programmed cells. Also, such a bias condition may lead to the partial programming of an erased cell.

At the start of the read cycle a single cell 2 within the memory array 50 is selected to be read, and this cell is connected, via its associated bit line 6 to the read line RL 125 via the switch 304. When the read cycles commences, the equilibration signal EQUIL on line 130 changes state such that the input equilibration circuit 144, and the output precharge and equilibration circuit 142 are all disabled. All precharging and clamping then terminates. The reference circuit 108 generates the current reference signal REF for comparison with the current signal on the accessed bit line. During a normal read operation the current reference signal REF generated by the reference circuit 108 is equal to half the sum of the currents passed by a programmed cell and an erased cell. It should be noted that the reference signal VREF on line 128 is held at the same level, before and throughout a read cycle, to generate the appropriate identical bias voltages on the read line RL 125 and the read reference RRL line 126, provided sufficient potential is provided by the signals AMP1 and AMP2 on lines 136 and 138. The voltage on the AMP1 signal line 136 provides the potential for the bias voltage on read line RL 125, and the voltage on the AMP2 signal line 138 provides the potential for the bias voltage on read reference line RRL 126.

The accessed cell 2 on the selected bit line will typically sink 60 to 100 µA if erased. As the bit lines (and the reference circuit) have a large capacitance associated therewith, this small current will only slightly modulate the bias voltage on the read line RL 125, such that there is only a very small voltage difference between the signals on the read RL and read reference RRL lines 125 and 126. However, the bias/cascode circuit 106 acts to amplify the signals on the read and read reference lines 125 and 126 onto the amplified outputs AMP1 and AMP2 on lines 136 and 138 respectively. The bias/cascode circuit 106 has a much smaller capacitive loading on its outputs connected to the amplified outputs AMP1 and AMP2 on lines 136 and 138. If all the current flowing in read line 125 flows in the amplified output line 136, and all the current flowing in the read reference line 126 flows in amplified output line 138, this smaller capacitance means that the small voltage differential between the signals RL and RRL on lines 125 and 126 is amplified and appears as a larger voltage differential between the signals AMP1 and AMP2 on lines 136 and 138. The differential voltage signal is therefore amplified before being input to the sense circuit 100.

At this stage of the read cycle the isolation circuit 102 is disabled such that its inputs AMP1 and AMP2 on line 136 and 138 are connected directly to its outputs SAIN1 and SAIN2 on lines 150 and 152 respectively. Hence, the amplified differential signal appears on the inputs of the sense circuit 100. A predetermined time after the read cycle has started the amplified differential signal will have been established on the outputs SAIN2 and SAIN2 on lines 150 and 152, and the control signal SENSE on line 154 changes state such that the cross-couple circuit 100 is released from its meta-stable state, and will be forced, by regenerative action, into one of its two stable states, which one being dependent on the state of the differential signal on its inputs.

It is important that throughout the read cycle the signal lines RL 125 and RRL 126 are biased to less than 1 V. As has been explained hereinabove, during the precharge portion of the read cycle the signals AMP1 and AMP2 on lines 136 and 138 are both connected to the supply voltage via the input precharge and equilibration circuit 144, and this provides adequate potential to the bias/cascode circuit 106 for biasing the signals RL and RRL on lines 124 and 126. However, when the cross-couple circuit is enabled and drives its outputs to full CMOS levels, the possibility arises that the potential of one of the signals AMP1 or AMP2 on lines 136 or 138 may fall to a level such that there is insufficient supply for either one of the signals RL or RRL on lines 125 or 126 to be correctly biased. The bit line 6 would then need to be precharged or restored to the bias voltage prior to the start of the next read cycle, which is likely to increase the read cycle time.

It is therefore important that some means for maintaining the correct bias on the lines 125 and 126 during the sensing operation is provided. In the described embodiment this is achieved by isolating the bias/cascode circuit 106 from the sense circuit 100 during the sense phase of the read cycle, and providing the signals AMP1 and AMP2 on lines 136 and 138 with a secondary independent supply voltage. This also isolates the large bit line capacitance from the outputs SAOUT and NOTSAOUT of the dynamic sense amplifier, such that the dynamic sense amplifier settles at its full CMOS output levels more quickly.

A predetermined short time after the amplified differential signal is established on the signals SAIN1 and SAIN2 on lines 150 and 152 of the sense circuit 100, the isolation circuit is enabled by the signal ISOLATE on line 227 to disconnect the signals AMP1 and AMP2 on lines 136 and 138 from the signals SAIN1 and SAIN2 on lines 150 and 152 respectively. A short time later or at the same time, but not before, the restore circuit 104 is enabled by the signal RESTORE on line 211. When enabled the restore circuit 104 applies the supply voltage Vcc to the signals AMP1 and AMP2 on the lines 136 and 138 and the correct bias voltage is maintained on the lines RL 125 and RRL 126. Hence during a second stage of the read cycle the restore circuit 104 and the isolation circuit 102 are enabled.

It should be apparent to a person skilled in the art that in the embodiment shown in FIG. 5 with the input precharge and equilibration circuit 144 connected between the signals AMP1 and AMP2, the precharge elements of such a circuit could be conveniently used to perform the restore operation and there would be no requirement for a separate restore circuit. In such a case the input precharge and equilibration circuit 144 would merely need to be controlled by a signal derived from gating the equilibration signal EQUIL and the restore signal RESTORE. However, in any implementations where there was not an input precharge and equilibration circuit provided between the isolation circuit and the bias/cascode circuit a restore circuit would be essential.

As the dynamic sense amplifier itself drives its outputs to full CMOS levels, then it can be used as a latch. However, the described preferred embodiment has a separate latch device 112 on the output of the dynamic sense amplifier to hold the data value sensed up until the end of the next read cycle. Hence the previous data value can be stored whilst the next data value is read, and hence the data hold time of the device is improved. The previous data can be held in the latch until the new data has been sensed and stored in the latch. Without the additional latch 112, the previous data value is lost as soon as the dynamic sense amplifier is precharged ready for the next sense cycle.

In the schematic diagram of FIG. 5, the output DB' of the latch device 112 is connected to an output pad 116 of the memory device via an output buffer 114, as is well know in the art.

Figure 6:
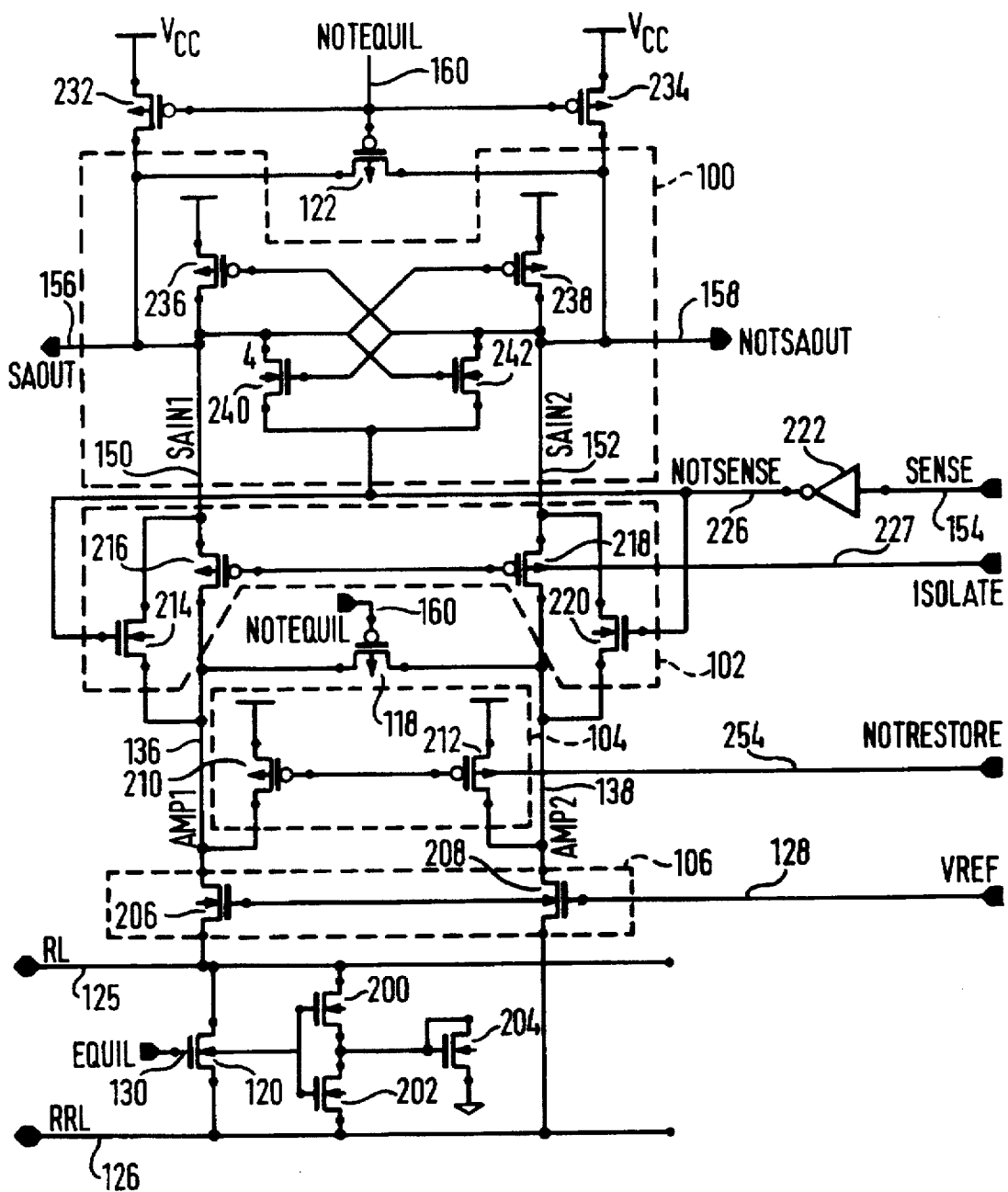
FIG. 6 shows a circuit implementation of the dynamic sense amplifier of FIG. 5 according to a preferred embodiment of the present invention.

The dynamic sense amplifier illustrated schematically in FIG. 5 will now be described more fully with reference to the preferred embodiment of FIG. 6, in which the dynamic sense amplifier is illustrated implemented with known circuit components. Like reference numerals are used in FIG. 6 for like parts in FIG. 5. The latch 112, output buffer 114 and output pad 116 are not shown in FIG. 6.

The input equilibration circuit 146 includes a transistor 120 together with transistors 200,202 and 204. The transistor 120 has one of its source/drain regions connected to the read line RL 125 and the other of its source/drain regions connected to the read reference line RRL 126. The transistor 200 has one of its source/drain regions connected to the read line RL 125 and the other of its source/drain regions connected to one of the source/drain regions of the transistor 202, the transistor 202 having the other of its source/drain regions connected to the read reference line RRL 126. The transistors 120,200 and 202 all have their gates connected to the control signal EQUIL on line 130. The transistor 204 is connected in a diode configuration with its gate connected to the common source/drain regions of the transistors 200 and 202, one of its source/drain regions connected to its gate, and the other of its source/drain regions connected to the lower supply rail (normally at ground voltage). This transistor 204 ensures correct bias at the read line RL and the read reference line RRL during the precharge phase.

The bias/cascode circuit 106 comprises a first n-type source-follower transistor 206 having its source connected to the read line RL 125 and its drain connected to the signal AMP1 on line 136, and a second n-type source-follower transistor 108 having its source connected to the read reference line RRL 126 and its drain connected to the signal AMP2 on line 138. The gates of the transistors 206 and 108 are both connected to the reference voltage VREF on line 128.

The restore circuit 104 comprises a first p-type transistor 210 having its source connected to the supply voltage and its drain connected to the signal AMP1 on line 136, and a second p-type transistor 212 having its source connected to the supply voltage and its drain connected to the signal AMP2 on line 138. Because the restore circuit 104 is implemented with p-channel transistor devices in the preferred embodiment, the gates of the p-channel transistors 210 and 212 are both connected to the inverse of the restoration control signal NOTRESTORE on line 254.

The input precharge and equilibration circuit 144 comprises only a p-channel equilibration transistor 118 in the preferred embodiment, having one of its source/drain regions connected to the signal AMP1 on line 136 and the other of its source/drain regions connected to the signal AMP2 on line 138. Because the equilibration transistor 118 is a p-channel device, its gate is connected to the inverse of the equilibration control signal NOTEQUIL on line 160. The input precharge and equilibration circuit 144 is not provided with any precharge circuitry in the preferred embodiment since, as will become apparent in the following description of the preferred embodiment of the sense circuit 100, in the preferred dynamic sense amplifier the output SAOUT on line 156 is connected directly to the input SAIN1 on line 150, and the output NOTSAOUT on line 158 is connected directly to the input SAIN2 on line 152. The output equilibration and precharge circuit 142 can therefore precharge the signals SAIN1 and SAIN2, AMP1 and AMP2 as well as the signals SAOUT and NOTSAOUT. However, it will be apparent to a person skilled in the art having reference to the following description of the output precharge and equilibration circuit 142 how the input precharge and equilibration circuit 144 could be adapted to include precharge devices if necessary.

The isolation circuit 102 comprises two n-type transistors 214 and 220 and two p-type transistors 216 and 218. The transistors 214 and 220 each have their respective sources connected to the signals AMP1 and AMP2 on lines 136 and 138 respectively, and their respective drains connected to the outputs SAIN1 and SAIN2 on lines 150 and 152 respectively. The transistors 216 and 218 each have their respective sources connected to the outputs SAIN1 and SAIN2 on lines 150 and 152 respectively and their respective drains connected to the signals AMP1 and AMP2 on lines 136 and 138 respectively. The gates of transistors 214 and 220 are connected to the sensing signal NOTSENSE on line 226 which is derived from the output of an inverter 222, the inverter receiving at its input the signal SENSE on line 154. The gates of the transistors 216 and 218 are connected to the isolation signal ISOLATE on line 227.

The output precharge and equilibration circuit 142 comprises three p-channel transistors 122,232 and 234. The p-channel transistor 232 has its source connected to the supply voltage and its drain connected to the true output SAOUT on the output terminal 156. The p-channel transistor 234 has its source connected to the supply voltage and its drain connected to the inverse output NOTSAOUT on output terminal 158. The p-channel transistor 122 has one of its source/drain regions connected to the output SAOUT on output terminal 156 and the other of its source/drain regions connected to the output NOTSAOUT on output terminal 158. The gates of the p-channel transistors 122,232 and 234 are all connected to the signal NOTEQUIL on line 160.

The sense circuit 100 senses a voltage differential on its inputs and comprises cross-coupled transistors 236,238,240, 242. The cross-coupled transistor 236 has its source connected to the supply voltage, its drain connected to the true output SAOUT on output terminal 156, and its gate connected to the inverse output NOTSAOUT on output terminal 158. The cross-coupled transistor 238 has its source connected to the supply voltage, its drain connected to the inverse output NOTSAOUT on output terminal 158, and its gate connected to the true output SAOUT on output terminal 156. The transistor 240 has its drain region connected to the true output SAOUT on output terminal 156, its source connected to the signal SENSE on line 226, and its gate connected to the inverse output NOTSAOUT on output terminal 158. The transistor 242 has its drain connected to the inverse output NOTSAOUT on output terminal 158, its source connected to the signal SENSE on line 226, and its gate connected to the true output SAOUT on output terminal 156.

The transistors 206 and 208 of the bias/cascode circuit 106 are biased in source-follower configuration, and therefore the potential of the source of either of these two transistors will be equal to the potential at their respective gates less the threshold voltage, Vtn, of the device. As was described hereinabove with reference to FIG. 5, it is desired to bias the read and read reference lines 125 and 126 to a value of less than 1 V. The threshold voltage Vtn of each of the two transistors 206,208 will be typically 0.8 V.

Therefore, if the reference signal VREF is fixed to a value of twice the threshold voltage Vtn, provided a sufficient voltage is supplied to the drains of the transistors 206 and 208 the read and read reference lines 125 and 126 will both be biased to the value Vtn, which is as required.

Prior to a read cycle, the signal NOTEQUIL on line 160 is low, and hence the p-type transistors 122,232 and 234 are all switched on. These three transistors precharge the outputs SAOUT and NOTSAOUT on output terminals 156 and 158 of the dynamic sense amplifier to the supply voltage Vcc and also clamp the two output terminals together. At this time the signal EQUIL on line 130 is high and the transistor 120 is switched on to clamp the read line RL 125 and the read reference line RRL 126 together. The sense clock signal SENSE on line 154 is low, such that the signal NOTSENSE on line 226 is high and the sense circuit 100 is therefore disabled since the signals SAIN1, SAIN2 and SENSE on the lines 150,152 and 226 respectively are all at the supply voltage. As the signal SENSE on line 226 is high, the n-channel transistors 214 and 220 are switched on. Furthermore, the signal ISOLATE on line 227 is low such that the p-channel transistors 216 and 218 are switched on.

Consequently, the signals AMP1 and AMP2 on lines 136 and 138 are also clamped to the supply voltage, and furthermore are clamped together by the p-channel transistor 118. Finally at this time, the signal NOTRESTORE on line 211 is high such that the transistors 210 and 212 are switched off. The reference signal VREF on line 128 is permanently held at a value equal to twice the threshold voltage of the transistors 206 and 208 during a read cycle. It will be understood, however, that if a separate precharge circuit was required for the signals AMP1 and AMP2, because the outputs of the sense circuit 100 were not connected to their respective inputs, the restore devices 210 and 212 could be enabled to provide precharge. This could be achieved by appropriate gating of the signal NOTRESTORE with the signal NOTEQUIL.

The derivation of the control signals used to control the preferred dynamic sense amplifier embodiment of FIG. 6 will now be described with reference to the control circuit of FIG. 7. The control circuit of FIG. 7 comprises three two-input NAND gates 400 to 404 and a plurality of inverters 406 to 416. The control circuit receives as inputs a global sense signal GLSEN on line 420, a selection signal SELECT on line 422, and an enable signal START on line 424. The control circuit generates the inverse of the restoration signal NOTRESTORE on line 254, the isolation signal ISOLATE on line 227, the sensing signal SENSE on line 154, the equilibration signal EQUIL on line 130, and the inverse of the equilibration signal NOTEQUIL on line 140.

The NAND gate 404 receives as inputs the signals SELECT and START. The NAND gate 400 receives as inputs the signal GLSEN and the otuput of the NAND gate 404 inverted by the inverter 408. The NAND gate 402 receives as inputs the output of the NAND gate 400 inverted by the inverter 406 and the output of the NAND gate 404 via the inverter 408. The signal NOTRESTORE is derived from the output of the NAND gate 402 inverted successively by the inverters 410 and 416. The signal RESTORE is derived from the output of the NAND gate 402 inverted by the inverter 410. The signal SENSE is derived from the output of the NAND gate 400 inverted by the inverter 406. The signal EQUIL is derived from the output of the NAND gate 404 inverted successively by the inverters 408 and 412. The signal NOTEQUIL is derived from the output of the NAND gate 404 inverted successively by the inverters 408,412 and 414.

The signal SELECT on line 422 is a signal that enables the control circuit on a memory device divided into a plurality of sub-arrays, each sub-array having a plurality (in this embodiment eight) of sense amplifiers. The signal SELECT will be set if that sub-array with which the control circuit is associated is selected for operation. The signal START is a control signal which allows the read cycle to commence and hence the precharge and equilibration circuitry is disabled in response to the signal START. In the preferred embodiment the signal START becomes active in response to the selected wordline becoming active. The signal GLSEN, which is applied to all the sense amplifiers in the memory device controls the timing of the clocking of the sense circuit. The signal GLSEN is timed to become active a fixed time after the read cycle becomes active in response to the signal START becoming active.

Figure 7:
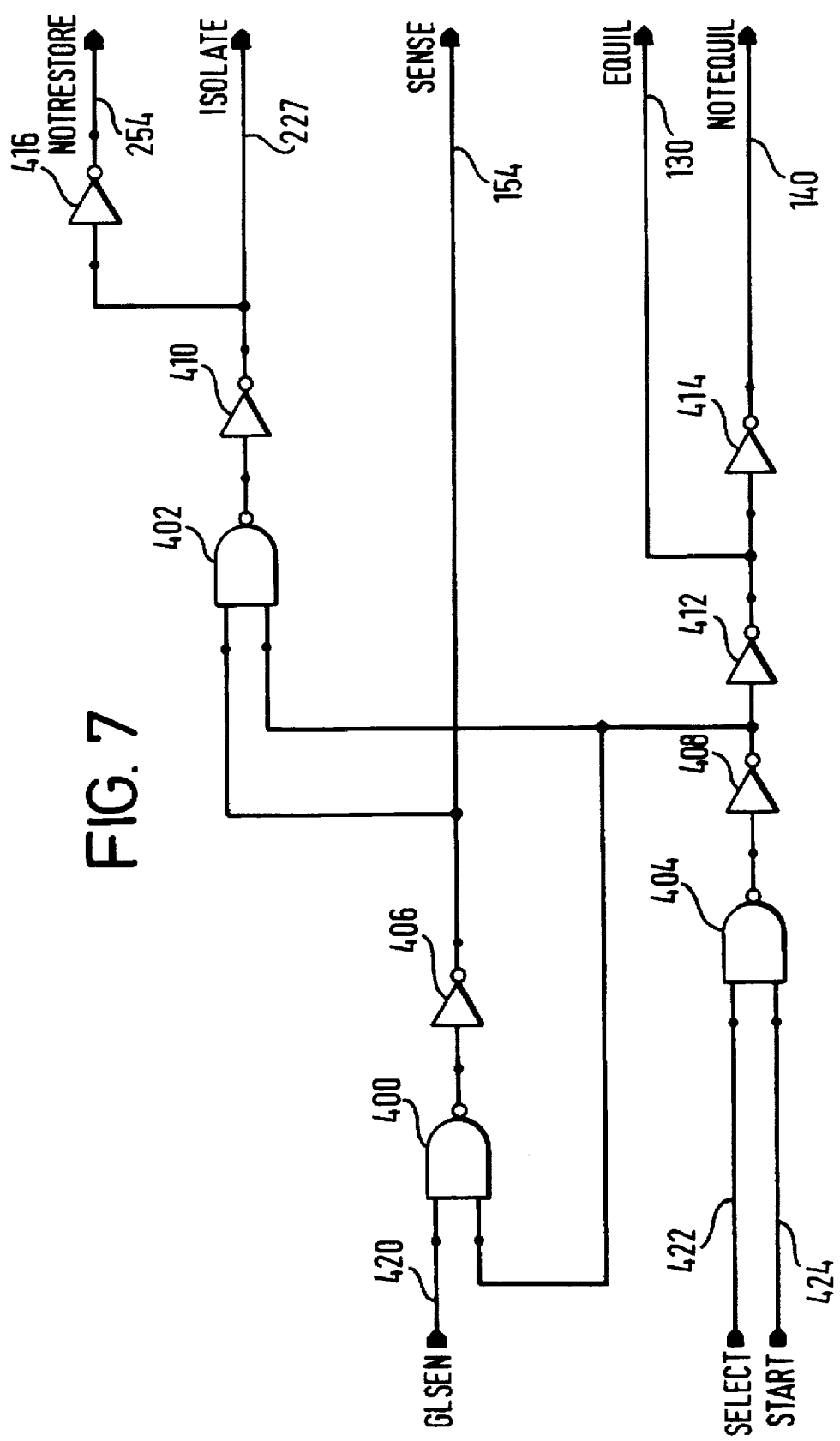
FIG. 7 shows an illustrative example of a circuit for generating the control signals used for controlling the dynamic sense amplifier of FIGS. 5 and 6.

It will therefore be understood, with reference to FIG. 7, that when the control circuit is disabled by the selection signal SELECT being at a low level, then the signals NOTRESTORE, ISOLATE and SENSE will be inactive, and the signals EQUIL and NOTEQUIL will be active. Therefore the dynamic sense amplifier will be in a precharge and equilibration state when not selected. Similarly even when selected by the signal SELECT going high, the control circuit will remain in this precharge and equilibration state as long as the signal START and the signal GLSEN are both low. When a sensing operation starts after the control circuit has been enabled by the signal SELECT, the signal START will go high, and consequently the signals EQUIL and NOTEQUIL will change state such that the precharge and equilibration operation terminates. The signals NOTRESTORE, ISOLATE and SENSE all remain inactive. A fixed time after the signal START goes high the signal GLSEN will go high and the signals SENSE, ISOLATE and NOTRESTORE will go active. Referring to FIG. 7, it can be seen that the propagation delay for the signal SENSE in response to the signal GLSEN is shorter than for the signals ISOLATE and NOTRESTORE. Therefore it is guaranteed that the sense circuit 102 commences the regenerative feedback action before its inputs are isolated from the sensed differential signal. If the signal ISOLATE went active before the signal SENSE the current through the isolation devices 216 and 218 would cut off and the differential signal on the input to the sense circuit 102 could not be guaranteed.

Referring back to FIG. 6 and as has been described hereinabove, at the start of the sensing operation the signal EQUIL goes low and the signal NOTEQUIL goes high. This releases the clamping of the read line RL 125 and read reference line RRL 126 due to the transistor 120, the clamping of the signals AMP1 and AMP2 on lines 136 and 138 due to the transistor 228, the clamping of the output terminals 156 and 158 due to the transistor 122, and the precharge of the output terminals 156 and 158 due to the transistors 232 and 234. A differential signal will develop between the read line RL 125 and the read reference line RRL 126, the state of which will depend on whether the cell accessed in the selected bit line is programmed or erased. The source-follower transistors 206 and 208 now act as cascode devices to amplify the voltage signals on their respective sources onto their respective drains. The voltage differential on the drains of the transistors 206 and 208 will be much greater than that on their respective sources, since the capacitance on the drain side is much lower than the capacitance on the source side as explained hereinabove with reference to FIG. 5. As the transistors 214,216,218 and 220 are all switched on, the voltage differential developed between the drains of the transistors 206 and 208 is also developed between the inputs SAIN1 and SAIN2 and therefore the complementary outputs SAOUT and NOTSAOUT on lines 156 and 158 respectively.

The time period between releasing the precharge and equilibration devices and releasing the cross-couple circuits is called the integration period. This period is so-called because the voltage change on a node (in this case each sense amplifier output) over a period of time is equal to the integral of the current through the node over that period of time divided by the capacitance associated with that node. Hence in the specific example of FIG. 6, after the precharge and equilibration period has ended the differential voltage on the outputs of the sense amplifier is given by the relationship:

$$V(SAOUT) - V(NOTSAOUT) = \frac{1}{C} \int [i(cell) - i(ref)] \cdot dt$$

Where C is the capacitance associated with each output node of the sense amplifier (assumed to be identical), i(cell) is the current due to the cell being read and i(ref) is the current due to the reference signal REF.

It can therefore be seen that by reducing the capacitance associated with the inputs to the sense amplifier the differential voltage developed in a given time period will be larger, and hence attention is given to the layout of the circuit in order to maximise this.

A short predetermined period of time after the start of the sense operation the signal SENSE on line 154 will go high, and consequently the signal NOTSENSE on line 226 will go low. The signals ISOLATE and NOTRESTORE on lines 227 and 211 respectively are also logically derived, by means described in detail hereinabove with reference to FIG. 7, from the same source as the signal SENSE on line 154, and therefore will go high and low respectively a fixed short time after the signal SENSE goes high. As a result of these signal changes the cross-couple circuit 100 is enabled since the signal NOTSENSE on line 226 goes low. The output signals SAOUT and NOTSAOUT on lines 156 and 158 respectively will therefore be forced apart due to the regenerative action of the cross-coupled transistors, and further amplification of the output signals to full CMOS levels takes place.

As a result of the signals ISOLATE and NOTSENSE going high and low respectively, the signals SAIN1 and SAIN2 on lines 150 and 152 are isolated from the signals AMP1 and AMP2 on lines 136 and 138 respectively. The capacitance of the read RL and read reference RRL lines 125 and 126 is therefore isolated from the output terminals 156,158 of the dynamic sense amplifier so that the outputs are able to settle at their final value more quickly.

The signal NOTRESTORE going low, however, causes the p-channel transistors 210 and 212 to switch on, so that the signals AMP1 and ANP2 on lines 136 and 138 are maintained at the potential of the supply voltage. Hence, the operation of the source-follower transistors 206 and 208, to ensure a bias voltage equal to the threshold voltage of these transistors on the read line RL 125 and the read reference line RRL 126, is maintained. If the correct bias voltage on the read line RL 125 and the read reference line RRL 126 was not maintained in this way, any potential on the read line or bit line may slowly discharge to ground via cell currents, and any potential on the read reference line may slowly discharge to ground via reference currents. Therefore these lines would need to be restored prior to a subsequent sense operation.

In the circuit implementation illustrated in FIG. 5, the data outputs on the outputs SAOUT and NOTSAOUT can be latched into a latch such as described hereinabove with reference to FIG. 4. The signals SENSE, ISOLATE, NOTRESTORE, NOTEQUIL and EQUIL can then be forced to their original states, ready for the next sensing operation.

Figure 8:
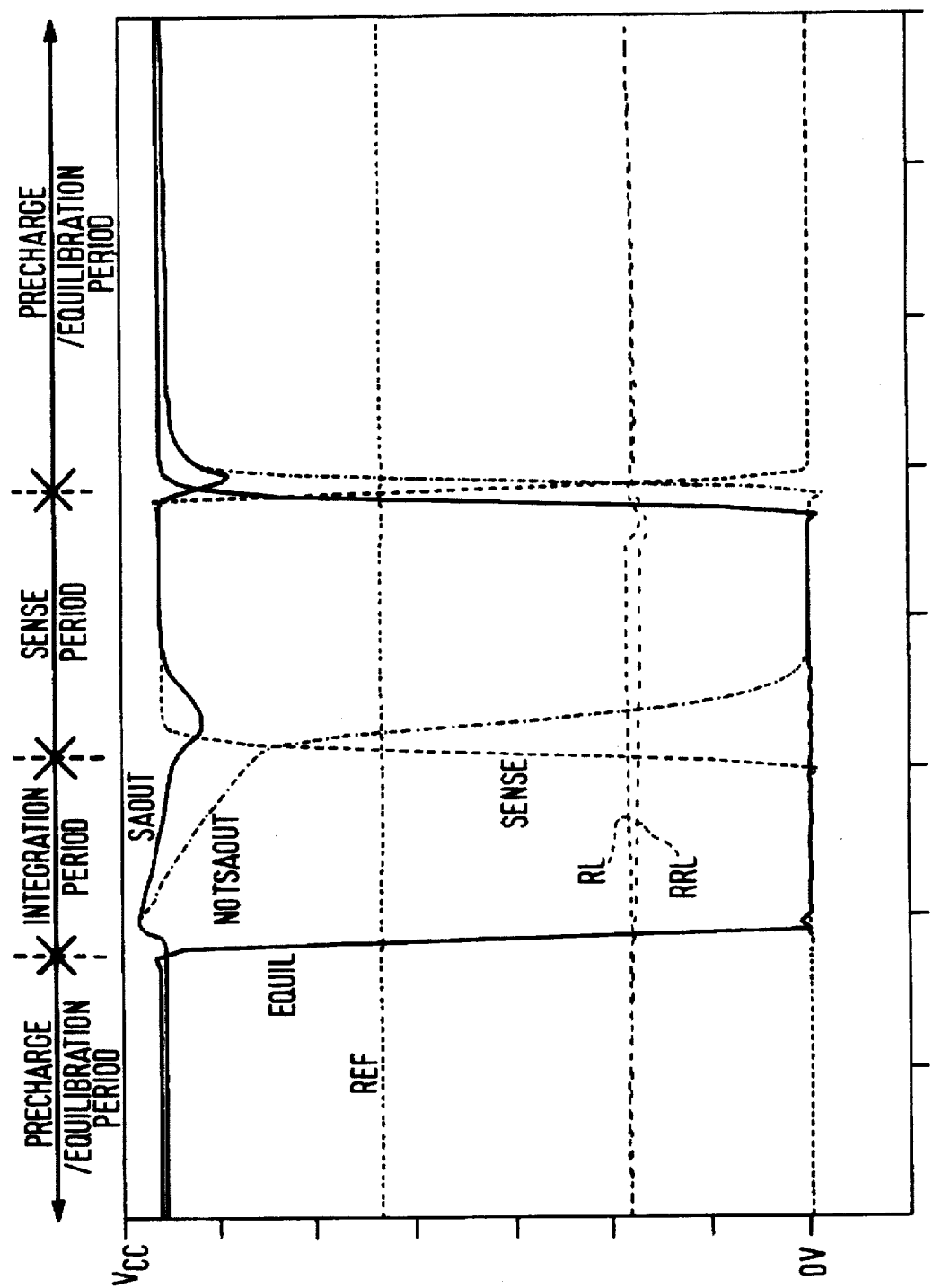
FIG. 8 shows the relative timing of the signals associated with the dynamic sense amplifier according to the preferred embodiment of FIG. 6.

FIG. 8 shows the timing relationship of selected signals of the sense circuit during a read cycle as described in detail hereinabove. The timing diagram shows the precharge/equilibration period during the beginning of the read cycle controlled by the signal EQUIL being high, the subsequent integration period when the signal EQUIL goes low and the outputs SAOUT and NOTSAOUT begin to move apart, the sense period after the signal SENSE goes high and the signals SAOUT and NOTSAOUT move to opposite CMOS logic levels, and the further precharge/equilibration period after the signal EQUIL returns high and the signal SENSE returns low, the signals SAOUT and NOTSAOUT returning to their precharged level of vcc.

What is claimed is:

1. An integrated circuit memory device comprising:

an array of memory cells arranged in rows and columns, with cells in a row being connected to a common word line and cells in a column being connected to a common bit line, each memory cell storing a data bit;

sense circuitry for reading a data bit stored in a selected one of said memory cells;

switch circuitry for connecting the bit line associated with the selected memory cell to said sense circuitry;

wherein said sense circuitry comprises:

a dynamic sense amplifier having first and second input terminals for connection respectively to the selected bit line and a reference signal and first and second output terminals, said dynamic sense amplifier also including latch circuitry for driving said first and second output terminals to opposite logic states in dependence on difference between a signal on said selected bit line and said reference signal, one of said logic states being determined by a supply voltage for the dynamic sense amplifier;

clamping circuitry connected to said first and second output terminals to hold them at a common precharged signal level and responsive to a release signal to release said first and second output terminals;

biasing circuitry for biasing the selected bit line to a predetermined voltage level;

isolation circuitry connected between said dynamic sense amplifier and said selected bit line and reference signal and operable during a first stage of a read cycle to adopt a first state to connect said selected bitline and reference signal to said dynamic sense amplifier and responsive to an isolate signal to adopt a second state in a second stage of the read cycle wherein said selected bitline and reference signal are isolated from said dynamic sense amplifier, said biasing circuitry being connected to said supply voltage via restore circuitry when the isolation circuit is in the second state.

2. An integrated circuit memory according to claim 1 wherein said biasing circuitry is connected to the supply voltage via said latch circuitry when the isolation circuitry is in said first state and said output signals are held at a common precharged signal level.

3. An integrated circuit memory according to claim 1 wherein said biasing circuitry is connected to the supply voltage via precharge circuitry when the isolation circuitry is in said first state and said output signals are held at a common precharged signal level.

4. An integrated circuit memory according to claim 3 wherein the restore circuitry provides said precharge circuitry.

5. An integrated circuit memory device according to claim 1 wherein each memory cell comprises a single transistor.

6. An integrated circuit memory device according to claim 5 wherein said single transistor is a floating gate electrically programmable transistor.

7. An integrated circuit memory device according to claim 1 wherein said biasing circuitry is connected between said dynamic sense amplifier and said selected bit line and serves to amplify the differential between said signal or said selected bit line and said reference signal during sensing.

8. An integrated circuit memory device according to claim 1 wherein the biasing circuitry comprises first and second biasing transistors each having a control terminal connected to receive a reference signal at a level to maintain the transistors in a conductive state and a controllable path connected between the selected bit line and the reference signal respectively and the isolation circuitry.

9. An integrated circuit memory device according to claim 8 wherein said restore circuitry comprises first and second restore transistors each having a control terminal connected to receive a restore signal and a controllable path connected between said supply voltage and said first and second biasing transistors respectively, said restore signal activating said restore transistors when said isolation circuitry is in said second state.

10. An integrated circuit memory device according to claim 1 wherein the supply voltage is 3.3 V±0.3 V.

11. An integrated circuit memory device according to claim 1 wherein the supply voltage is 5 V±0.5 V.

12. An integrated circuit memory device according to claim 1 wherein said reference signal is supplied by a reference circuit connected to a capacitance arranged to match the capacitance of the selected bit line.

13. An integrated circuit memory device according to claim 12 which comprises a further array of memory cells arranged in rows and columns, with cells in a row being connected to a common wordline and cells in a column being connected to a common bit line, each memory cell storing a data bit; and further switch circuitry for connecting a bit line corresponding to the bit line associated with the selected memory cell to said reference circuit whereby said corresponding bit line provides a matched capacitance.

14. An integrated circuit memory device according to claim 12 or 13 wherein the reference circuit includes a constant current generator for generating said reference signal.

15. An integrated circuit memory device according to claim 1 wherein said sense circuitry comprises a plurality of dynamic sense amplifiers and associated clamping circuitry, biasing circuitry and isolation circuitry.

16. An integrated circuit memory device comprising:

an array of memory cells arranged in rows and columns, with cells in a row being connected to a common wordline and cells in a column being connected to a common bitline, each memory cell storing a data bit;

sense means for reading a data bit stored in a selected one of said memory cells;

switch means for connecting the bit line associated with the selected memory cell to said sense means;

wherein said sense means comprises:

a dynamic sense amplifier having first and second input terminals for connection respectively to the selected bit line and a reference signal, and first and second output terminals, said dynamic sense amplifier also including latch means for driving said first and second output terminals to opposite logic states in dependence on difference between a signal on said selected bit line and said reference signal, one of said logic states being determined by a supply voltage for the dynamic sense amplifier;

clamping means connected to said first and second output terminals to hold them at a common precharged signal level and responsive to a release signal to release said first and second output terminals;

biasing means for biasing the selected bit line to a predetermined voltage level;

isolation means connected between said dynamic sense amplifier and said selected bit line and reference signals; and operable during a first stage of a read cycle to adopt a first state to connect said selected bitline and reference signal to said dynamic sense amplifier and responsive to an isolate signal to adopt a second state in a second stage of the read cycle wherein said selected bitline and reference signal are isolated from said dynamic sense amplifier, said biasing circuitry being connected to said supply voltage via restore circuitry when the isolation means is in the second state.

17. An integrated circuit memory device according to claim 16 wherein each memory cell comprises a single transistor.

18. An integrated circuit memory device according to claim 17 wherein said single transistor is a floating gate electrically programmable transistor.

* * * * *